(12) United States Patent
Kraver et al.

(10) Patent No.: US 12,085,423 B2
(45) Date of Patent: Sep. 10, 2024

(54) SENSOR INTERFACE CIRCUIT, SENSOR SYSTEM, AND METHOD OF SIGNAL MEASUREMENT

(71) Applicant: NXP USA, Inc., Austin, TX (US)

(72) Inventors: Keith L. Kraver, Gilbert, AZ (US); Pascal Kamel Abouda, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 401 days.

(21) Appl. No.: 17/313,554

(22) Filed: May 6, 2021

(65) Prior Publication Data
US 2021/0381854 A1 Dec. 9, 2021

(30) Foreign Application Priority Data
Jun. 3, 2020 (EP) .................... 20305583

(51) Int. Cl.
G01D 5/24 (2006.01)
G01L 9/12 (2006.01)
G01R 27/26 (2006.01)

(52) U.S. Cl.
CPC ............ *G01D 5/24* (2013.01); *G01L 9/125* (2013.01); *G01R 27/2605* (2013.01)

(58) Field of Classification Search
CPC ...... G01D 5/24; G01L 9/125; G01R 27/2605; G01P 15/125
See application file for complete search history.

(56) References Cited

U.S. PATENT DOCUMENTS 9,615,744 B2 4/2017 Denison et al.
9,983,032 B1* 5/2018 Kraver .................. G01R 27/26
2013/0063165 A1 3/2013 Balachandran et al.
2016/0380643 A1* 12/2016 Coban .................. H03M 1/002
                                                                341/118
2017/0370976 A1 12/2017 Lin et al.

FOREIGN PATENT DOCUMENTS

WO WO-2017209690 A1 * 12/2017 ......... G01R 27/2605

OTHER PUBLICATIONS

Shao Lichun et al 2006 J. Phys.: Conf. Ser. 34 1014 (Year: 2006).*
Muratore et al.: "A Capacitive Sensor Interface for High-Resolution Acquisitions in Hostile Environments", VII Latin American Symposium on Circuits and Systems (LASCAS) 2016, 4 pages.

* cited by examiner

*Primary Examiner* — Alexander Satanovsky
*Assistant Examiner* — Asm Fakhruddin

(57) ABSTRACT

A sensor interface circuit includes a continuous-time capacitance-to-voltage (C/V) converter having C/V input and output ends, the C/V input end being configured for electrical connection with first and second sense nodes of a capacitive sensor. A filter circuit is electrically coupled to the C/V output ends. The filter circuit has first and second resistors at corresponding first and second filter input ends of the filter circuit, a capacitor connected between first and second filter output ends of the filter circuit, and a chopper circuit interposed between the first and second filter input ends and the first and second filter output ends. A buffer circuit is electrically coupled with the first and second filter output ends of the filter circuit. The filter circuit applies low pass filtering of sense signals from the capacitive sensor before sampling and demodulation operations to reduce high-frequency interference in the sense signals.

20 Claims, 7 Drawing Sheets

SENSOR INTERFACE CIRCUIT, SENSOR SYSTEM, AND METHOD OF SIGNAL MEASUREMENT

CROSS-REFERENCE TO RELATED APPLICATIONS

This application claims the priority under 35 U.S.C. § 119 of European patent application no. 20305583.5, filed Jun. 3, 2021 the contents of which are incorporated by reference herein.

TECHNICAL FIELD OF THE INVENTION

The present invention relates generally to sensor technologies. More specifically, the present invention relates to a sensor interface circuit with reduced susceptibility to electromagnetic interference, a sensor system implementing the sensor interface circuit, and a method of signal measurement.

BACKGROUND OF THE INVENTION

A capacitive sensor device, such as a Coriolis-based gyroscope transducer, an accelerometer, a pressure sensor, and the like, outputs a capacitive signal indicative of measurements or other properties of the capacitive sensor device. Subsequent signal conditioning for such devices can be more efficient by first converting the capacitance signal to an analog voltage signal, processing the analog voltage signal, and converting the analog voltage signal to a digital representation of the signal.

Many sensor systems include a sensor die (also referred to as a transducer die) and a measuring circuit die (application specific integrated circuit, ASIC) in which the measuring circuit die performs the conversion of the capacitance signal, signal processing and analog-to-digital conversion operations. The input and output pads of the sensor die and the measuring circuit die may be suitably connected by wire bonds. These wire bonds are susceptible to external electromagnetic interference (EMI) that can inject charge (e.g., an interference signal component) into the sense nodes of the sensor which can introduce error into the desired signal. In view of the above, there is a need for sensor interface circuits with reduced susceptibility to electromagnetic interference.

SUMMARY

Aspects of the disclosure are defined in the accompanying claims.

In a first aspect, there is provided a sensor interface circuit comprising a continuous-time capacitance-to-voltage (C/V) converter having a C/V input and output ends, the C/V input end being configured for electrical connection with first and second sense nodes of a capacitive sensor; a filter circuit having first and second resistors at corresponding first and second filter input ends of the filter circuit, a capacitor connected between first and second filter output ends of the filter circuit, and a chopper circuit interposed between the first and second filter input ends and the first and second filter output ends, wherein the C/V output end of the continuous-time C/V converter is electrically coupled to the first and second filter input ends of the filter circuit; and a buffer circuit electrically coupled with the first and second filter output ends of the filter circuit.

In a second aspect, there is provided a method comprising receiving, at a continuous-time capacitance-to-voltage (C/V) converter, first and second sense signals from a capacitive sensor; generating, at the continuous-time C/V converter, a raw voltage signal in response to the first and second sense signals, each of the first and second sense signals including an interference signal component, and the raw voltage signal including the interference signal component; attenuating the interference signal component in the raw voltage signal at a filter circuit to produce a filtered voltage signal; and following attenuation of the interference signal component, down-converting the filtered voltage signal to produce a baseband analog data stream.

In a third aspect, there is provided a sensor system comprising a first die having a capacitive sensor implemented thereon, the capacitive sensor having a first sense node and a second sense node; and a second die, having a continuous-time capacitance-to-voltage (C/V) converter, a filter circuit, and a buffer circuit implemented thereon, wherein the continuous-time C/V converter has C/V input and output ends, the C/V input end being configured for electrical connection with the first and second sense nodes of the capacitive sensor, the continuous-time C/V converter comprising a continuous-time gain stage implemented with a capacitor feedback stage, and further implemented with a direct current (DC) feedback circuit, wherein the DC feedback circuit is configured to set a DC bias for the continuous-time gain stage; the filter circuit has first and second resistors at corresponding first and second filter input ends of the filter circuit, a capacitor connected between a first and second filter output ends of the filter circuit, and a chopper circuit interposed between the first and second filter input ends and the first and second filter output ends, wherein the C/V output end is electrically coupled to the first and second filter input ends; and the buffer circuit is electrically coupled with the first and second output ends of the filter circuit. Bond wires electrically connect the first and second sense nodes of the first die to an input end of the continuous-time C/V converter of the second die.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a sensor interface circuit, a sensor system, and a method of signal measurement. More particularly, the sensor interface circuit includes a continuous-time capacitance-to-voltage (C/V) converter and a passive anti-aliasing filter (AAF), in which the AAF is added around an output chopper circuit. In this sensor interface circuit architecture, a sensor output signal from a capacitive sensor is first sampled by an active sample-and-hold circuit at the input to an analog-to-digital converter after filtering at the AAF. The output chopper circuit is interposed between the resistors and a capacitor of the AAF so that the raw voltage signal from the continuous-time C/V is filtered before the chopping operation (e.g., demodulation). By filtering the raw voltage signal prior to demodulation, the high-frequency interference components in the raw voltage signal may be attenuated before down-conversion. Further, the bandwidth of the AAF may not attenuate signals in the signal band of interest, which at the output of the continuous-time C/V, is a small band of frequencies around the chopper frequency. Consequently, the architecture of the sensor interface circuit may have reduced susceptibility to electromagnetic interference, therefore resulting in less error in the desired signal.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

Figure 1:
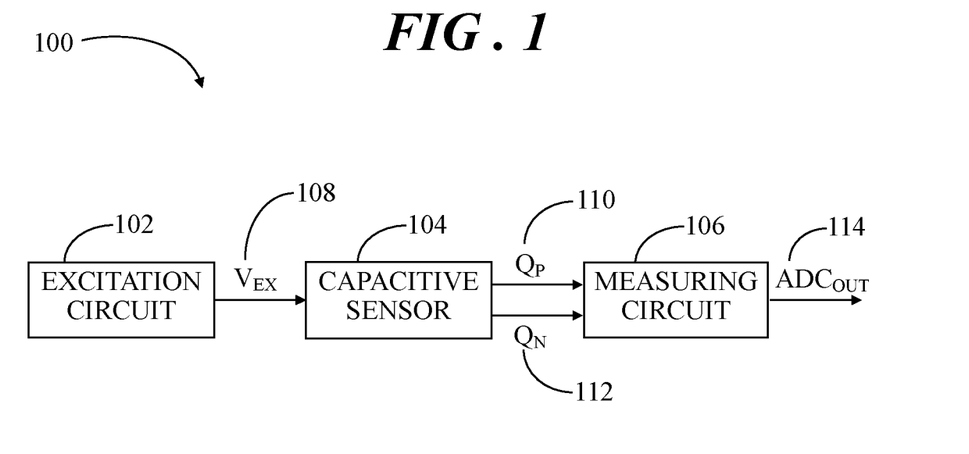
FIG. 1 shows in a simplified and representative form a block diagram of a sensor system.

Referring to FIG. 1, FIG. 1 shows in a simplified and representative form a block diagram of a sensor system 100. In this example, sensor system 100 includes an excitation circuit 102 electrically coupled to a capacitive sensor 104, and a measuring circuit 106 electrically coupled to capacitive sensor 104. Capacitive sensor 104 may be a Coriolis-based gyroscope transducer, an accelerometer, a pressure sensor, and the like, that outputs capacitive signals indicative of measurements or other properties of an external stimulus.

Excitation circuit 102 is configured to excite capacitive sensor 104 by applying an excitation waveform, $V_{EX}$, 108 to capacitive sensor 104. In response to excitation waveform 108, measuring circuit 106 is configured to measure results from the excitation. That is, excitation results in the form of a first charge signal, referred to herein as a first sense signal 110 ($Q_P$) and a second charge signal, referred to herein as a second sense signal 112 ($Q_N$), in response to a physical stimulus. First and second sense signals 110, 112 are conveyed to measuring circuit 106 from capacitive sensor 104.

Measuring circuit 106 generally includes a signal chain (discussed below) that is used to process first and second sense signals 110, 112 from capacitive sensor 104. In an embodiment, measuring circuit 106 may therefore output a desired digital data stream (e.g., a digital sense signal 114, labeled $ADC_{OUT}$). Digital sense signal 114 is indicative of the stimulus being sensed.

Figure 2:
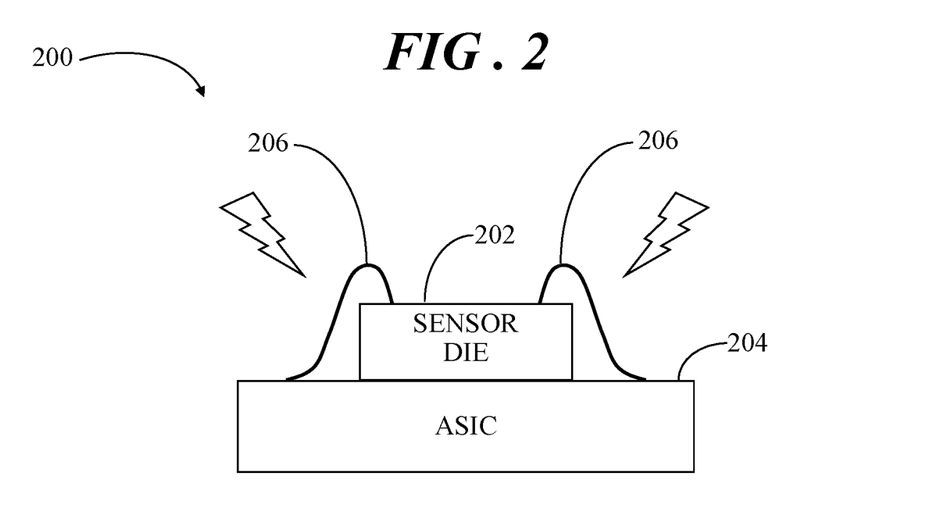
FIG. 2 shows in a simplified and representative form a side view of a sensor system that includes a sensor die and an application specific integrated circuit (ASIC) die.

FIG. 2 shows in a simplified and representative form a side view of a packaged sensor system 200 that includes a sensor die 202 and an application specific integrated circuit (ASIC) die 204. In an example, excitation circuit 102 and measuring circuit 106 may be implemented on one or more application specific integrated circuits (ASIC) separate from capacitive sensor 104. Thus, capacitive sensor 104 may be implemented in a first die, e.g., sensor die 202, and excitation and measuring circuits 102 and 106 may be implemented in a second die, e.g., ASIC die 204. Bond wires 206 suitably interconnect sensor die 202 with ASIC die 204, as will be discussed in greater detail below.

As will be discussed in significantly greater detail below, high-frequency electromagnetic interference (EMI), symbolized in FIG. 2 by lightning bolts, can corrupt the desired signal in a sensing system. More particularly, EMI on bond wires 206 that connect sensor die 202 to ASIC die 204 can inject charge into the sense nodes of capacitive sensor 104. In an example, the frequency of the EMI may span from tens of kilohertz to hundreds of megahertz. In typical sensor systems, the charge amplifier (e.g., a charge-to-voltage converter) in measuring circuit 106 may be a discrete-time system, implemented with switched-capacitor circuits. In a discrete-time system, the charge from capacitive sensor 104 is collected by the charge amplifier feedback capacitance and is converted to a discrete-time voltage signal. The sampling nature of the charge amplifier may alias the high-frequency interference within the signal frequency band. Additionally, demodulation chopper circuits may be employed in measuring circuit 106 when an excitation chopper (also referred to as a modulation chopper) is implemented to reject the charge amplifier low-frequency noise and offset, and leakage on the sense nodes of capacitive sensor 104. Thus, a demodulation chopper following the charge amplifier may translate the interference into the signal frequency band, which cannot be removed by subsequent low-pass filtering. When differential signaling is implemented, chopper circuits may provide efficient frequency translation. However, the harmonic content produced by multiplying the signal by +/−1 implies opportunity for high-frequency content to corrupt the signal band. Embodiments disclosed herein entail an sensor interface circuit that applies low-pass filtering prior to any sampling or demodulation operations to reduce the amount of high-frequency interference translating into the signal band. Additionally, the circuitry can interface to a conventional analog-to-digital converter.

Figure 3:
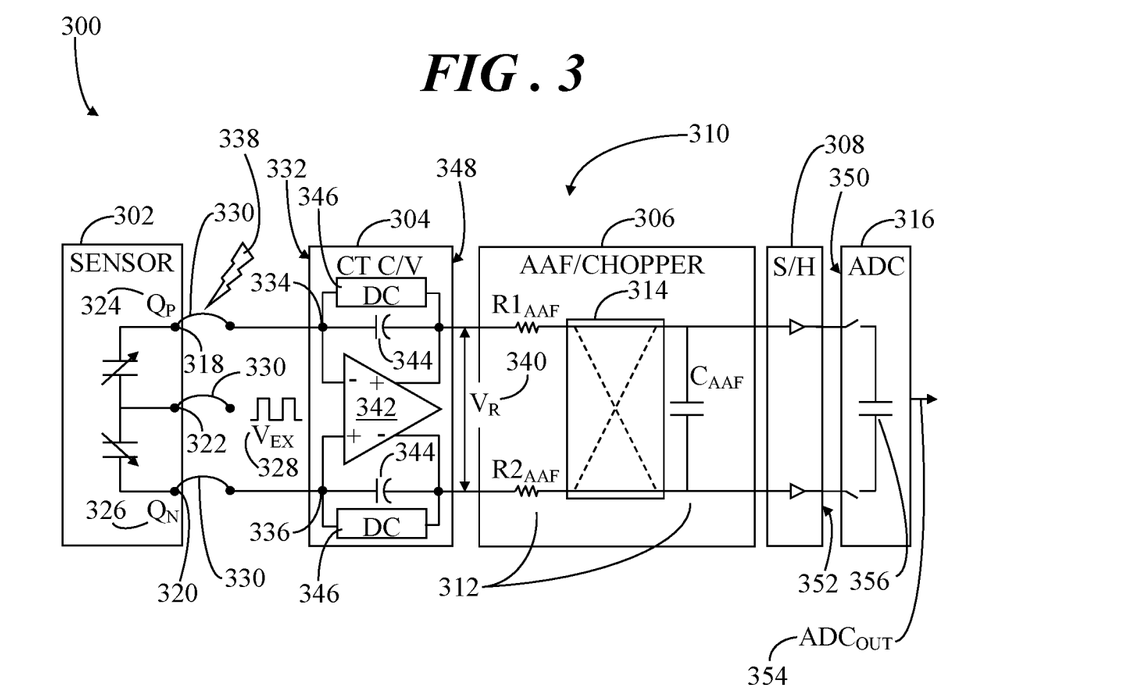
FIG. 3 shows a block diagram of a sensor system in accordance with an embodiment.

FIG. 3 shows a block diagram of a sensor system 300 in accordance with an embodiment. Sensor system 300 includes a first die (e.g., sensor die 202, FIG. 2) having a capacitive sensor 302 implemented thereon and a second die (e.g., ASIC die 204, FIG. 2) having a continuous-time capacitance-to-voltage (C/V) converter 304 (labeled CT C/V), a filter circuit 306 (labeled AAF/CHOPPER), and a buffer circuit 308 (labeled S/H) implemented thereon. In general, continuous-time C/V converter 304, filter circuit 306, and buffer circuit 308 constitute an analog frontend, e.g., a sensor interface circuit 310, of sensor system 300. As will be discussed in greater detail below, filter circuit 306 includes a low pass filter, referred to herein as an anti-aliasing filter 312, added around a chopper circuit 314. As such, filter circuit 306 is collectively labeled AAF/CHOPPER. In some embodiments, an analog-to-digital converter 316 (ADC) may be implemented on the second die or on another die separate from the second die. In some embodiments, an excitation circuit (e.g., excitation circuit 102, FIG. 1) may be implemented on the second die or on another die separate from the second die.

Capacitive sensor 302 may be any of a variety of capacitive transducers which may be configured to sense a desired stimulus (e.g., pressure, acceleration, angular velocity, and so forth). For example, capacitive sensor 302 may be a parallel-plate electrode in which one of the plates is movable relative to the other plate, with variable gaps being formed between the fixed and movable plates. In an embodiment, capacitive sensor 302 may include first and second sense nodes 318, 320, and a third node interposed between first and second sense nodes 318, 320 and referred to herein as a middle node 322. Capacitive sensor 302 is configured to produce a first charge signal, referred to herein as a first sense signal 324 and labeled $Q_P$, at first sense node 318 and is configured to produce a second charge signal, referred to herein as a second sense signal 326 and labeled $Q_N$, at second sense node 320. Middle node 322 is configured to receive an alternating voltage waveform, e.g., an excitation voltage 328, labeled $V_{EX}$. Excitation voltage 328 is produced, for example, at an input chopper or mixer (not shown) of an excitation circuit (e.g., excitation circuit 102, FIG. 1). In general, excitation voltage 328 is configured to charge the capacitors of capacitive sensor 302 and up-convert first and second sense signals 320, 322 to a chopper fundamental frequency of chopper circuit 314. In response to a physical stimulus, the width of the variable gaps between the fixed and movable plates of capacitive sensor 302 change, which in turn causes first and second sense signals 324, 326 to change.

Bond wires 330 electrically connect first and second sense nodes 318, 320 of capacitive sensor 302 on the first die (e.g., sensor die 202) to a C/V input end 332 of continuous-time C/V converter 304 of the second die (e.g., ASIC die 204). In this example, C/V input end 332 includes a first input node 334 and a second input node 336. One of bond wires 330 connects first input node 334 to first sense node 318 of capacitive sensor 302 and another one of bond wires 330 connects second input node 336 to second sense node 320 of capacitive sensor 302.

EMI 338 (represented by a lightning bolt) terminating on bond wires 330 can inject charge into first and second sense nodes 318, 320 of capacitive sensor 302 such that first and second sense signals 324, 326 may include an interference signal component resulting from EMI 338. The energy from EMI 338 does not symmetrically inject charge error into first and second sense nodes 318, 320. That is, the source of EMI 338 is not necessarily equidistant from first and second sense nodes 318, 320, and even if the source of EMI 338 is equidistant from first and second sense nodes 318, 320, the parasitic capacitances around first and second sense nodes 318, 320 is not equivalent. Therefore, the charge error on first sense node 318 is likely to be different from the charge error on second sense node 320. The differing charge error can result in a differential error whose in-band component is indistinguishable from the desired signal. Interface circuit 310 effectively forms a signal chain to process first and second sense signals 324, 326 and to attenuate the interference signal component from first and second sense signals 324, 326.

Continuous-time C/V converter 304 receives the charge signal (e.g., first and second sense signals 324, 326) at C/V input end 332 and converts the charge signal from capacitive sensor 302 into a raw voltage signal 340, labeled $V_R$. Raw voltage signal 340 may be considered a continuous signal, or equivalently, a continuous-time signal or an analog signal. That is, raw voltage signal 340 is a signal that will have some value at every instant in time. In contrast, a discrete-time signal has a values occurring at distinct, separate "points in time." Thus, a signal that is sampled or measured at a particular sampling frequency may be considered a discrete-time signal.

Continuous-time C/V converter 304 can include a continuous-time gain stage 342 implemented with a capacitor feedback stage 344 (e.g., two capacitor feedback stages 344 in this differential circuit example). By utilizing continuous-time C/V converter 304 with capacitance feedback, there is no direct current (DC) path to ground at first and second sense nodes 318, 320. In the absence of a DC path to ground, current leakage on first and second sense nodes 318, 320 could cause continuous-time C/V converter 304 to eventually saturate. Accordingly, continuous-time C/V converter 304 may be implemented with a DC feedback circuit 346 (e.g., two DC feedback circuits 346 in this differential circuit example).

A relatively straightforward topology for each of DC feedback circuits 346 may be a resistor connecting a C/V output end 348 of continuous-time C/V converter 304 to C/V input end 332 of continuous-time C/V converter 304. Another topology for each of DC feedback circuits 346 may be back-to-back diodes connecting C/V output end 348 of continuous-time C/V converter 304 to C/V input end 332 of continuous-time C/V converter 304 to obtain a relatively high resistance in a small area. In yet another topology, DC control with an integrator in the feedback path of each DC feedback circuit 346 may alternatively be implemented due to the potential for leakage current on capacitive sensor 302. Accordingly, it should be understood that various suitable options for DC feedback circuit 346 may be implemented with continuous-time C/V converter 304.

Figure 4:
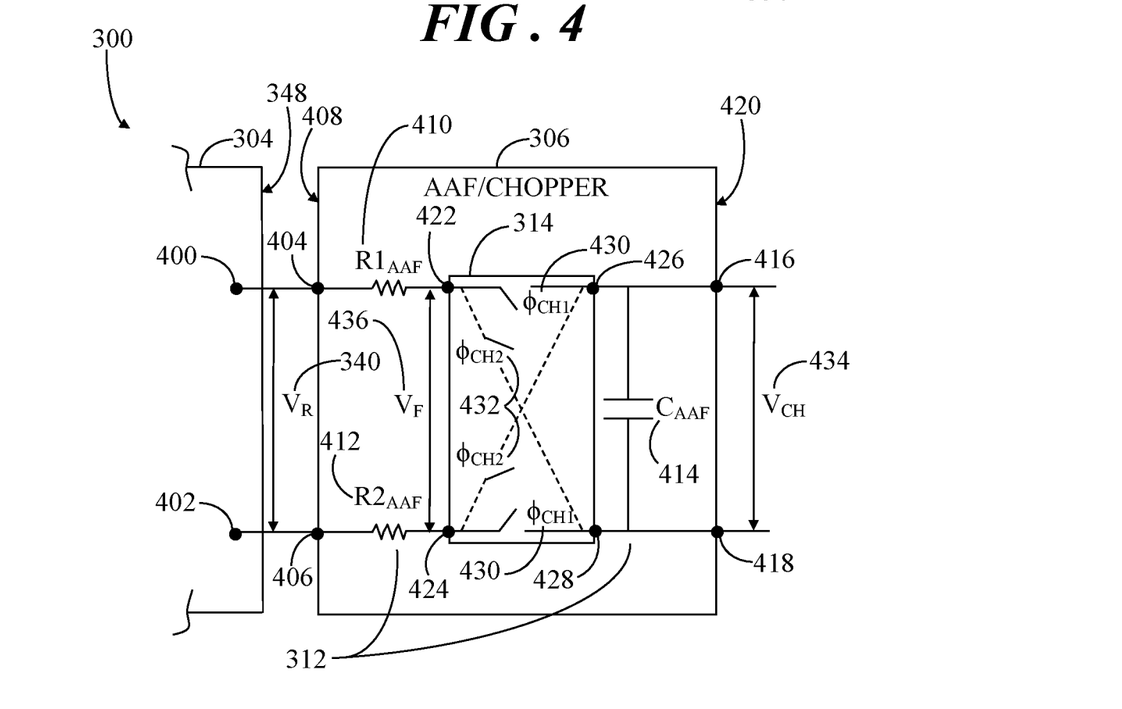
FIG. 4 shows schematic diagram of a filter circuit of the sensor system of FIG. 3.

Referring now to FIG. 4 in connection with FIG. 3, FIG. 4 shows a schematic diagram of filter circuit 306 of sensor system 300. First and second C/V output nodes 400, 402 at C/V output end 348 of continuous-time C/V converter 304 are electrically coupled with first and second filter input nodes 404, 406 at a filter input end 408 of filter circuit 306. Filter circuit 306 includes first and second resistors 410, 412 (labeled $R1_{AAF}$ and $R2_{AAF}$) at corresponding first and second filter input nodes 404, 406 of filter circuit 306 and a capacitor 414 (labeled $C_{AAF}$) coupled between first and second filter output nodes 416, 418 at a filter output end 420 of filter circuit 306. In general, first and second resistors 410, 412 and capacitor 414 of filter circuit 306 constitute the passive anti-aliasing filter 312.

Chopper circuit 314 of filter circuit 306 is interposed between filter input end 408 and filter output end 420. More particularly, first resistor 410 is connected between first filter input node 404 and a first chopper input node 422 and second resistor 412 is connected between second filter input node 406 and a second chopper input node 424. A first chopper output node 426 is electrically connected to first filter output node 416 and a second chopper output node 428 is electrically connected to second filter output node 418.

Chopper circuit 314 receives a first chopper clock signal 430 ($\phi_{CH1}$) and a second chopper clock signal 432 ($\phi_{CH2}$). In an example, first chopper clock signal 430 denotes one phase of chopper circuit 314 (e.g., a positive phase) and second chopper clock signal 432 denotes the other phase of chopper circuit 314 (e.g., a negative phase). First and second chopper clock signals 430 and 432 are not asserted at the same time. Thus, chopper circuit 314 yields a baseband analog data stream 434, $V_{CH}$, at both a positive chopping phase and a negative chopping phase.

In general, chopper circuit 314 (sometimes referred to as an output chopper or output mixer) frequency chops, or down-converts, raw analog voltage 340 back to the baseband frequency (i.e., shifts the signal band frequency by the fundamental chopper frequency). Placing chopper circuit 314 between the resistor (i.e., first and second resistors 410, 412) and the capacitor (i.e., capacitor 414) of anti-aliasing filter 312 serves two purposes. Firstly, raw voltage signal 340 from continuous-time C/V converter 304 is filtered prior to the chopping operation so that high-frequency interference signal components in raw voltage signal 340 may be attenuated (i.e., diminished) to produce a filtered voltage signal 436, $V_F$, before down-conversion. Secondly, the bandwidth of anti-aliasing filter 312 does not attenuate raw voltage signal 340 in the signal band of interest, which at C/V output end 348, is a small band of frequencies around the fundamental chopper frequency.

Thus, baseband analog data stream 434, in which the interference signal component is attenuated prior to down-conversion is output from filter circuit 306 at first and second filter output nodes 404, 406 of filter circuit 306. Accordingly, continuous-time C/V converter 304 passes the interference signal component in raw voltage signal 340 to anti-aliasing filter 312 without sampling. Anti-aliasing filter 312 reduces the amplitude of high-frequency components, especially at odd harmonics of the chopper fundamental frequency that would otherwise translate to baseband. The first sampling instant is therefore after filtering and chopping at filter circuit 306.

With continued reference to FIGS. 3 and 4, ADC 316 has an ADC input end 350 coupled to a buffer output end 352 of buffer circuit 308. ADC 316 may be configured to convert discrete-time analog voltage values (discussed below) output from buffer circuit 308 to a digital data stream 354. In accordance with an embodiment, buffer circuit 308 between filter circuit 306 and ADC 316 protects the signal charge on capacitor 414 of anti-aliasing filter 312 from transferring to a sampling capacitor 356 of ADC 316, which could otherwise attenuate the signal.

Figure 5:
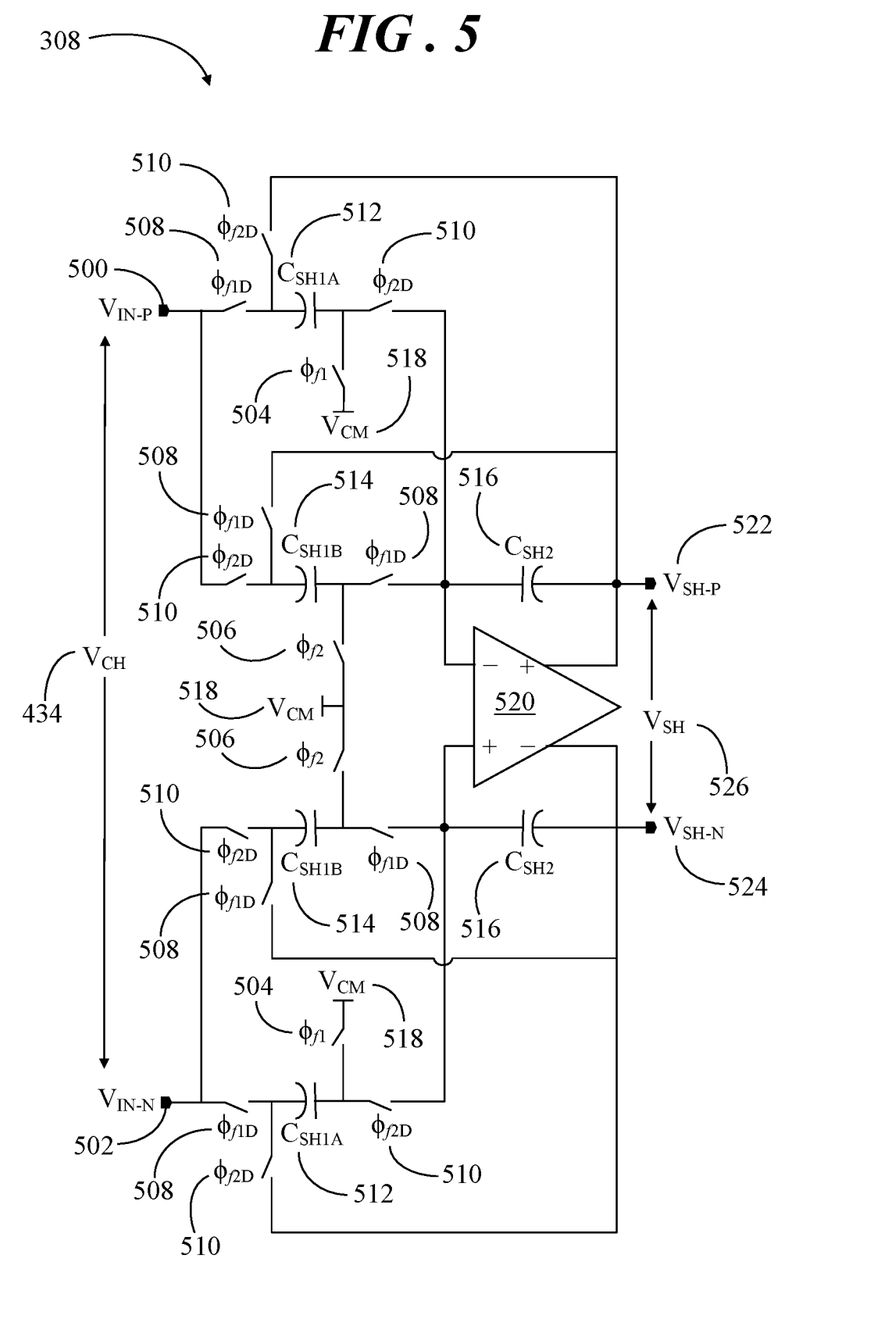
FIG. 5 shows a schematic diagram of a buffer circuit of the sensor system of FIG. 3.

FIG. 5 shows a schematic diagram of buffer circuit 308 of sensor system 300 (FIG. 3). Buffer circuit 308 performs a filtered, sample-and-hold function. That is, buffer circuit 308 is configured to sample chopped output voltage 434 from filter circuit 306 (FIG. 3) without degrading the signal charge on the anti-aliasing filter capacitance, filter the chopper fundamental frequency and harmonics, and enable connection to ADC 316 (FIG. 3).

Buffer circuit 308 includes a positive voltage input node 500 and a negative voltage input node 502 configured to receive the positive and negative phases ($V_{IN-P}$ and $V_{IN-N}$) which together form chopped output voltage 434. In some embodiments, buffer circuit 308 includes a phase one clock 504 ($\phi_{p1}$), a phase two clock 506 ($\phi_{p2}$), a delayed phase one clock 508 ($\phi_{p1D}$), a delayed phase two clock 510 ($\phi_{p2D}$), first input sampling capacitors 512 ($C_{SH1A}$), second input sampling capacitors 514 ($C_{SH1B}$), feedback capacitors 516 ($C_{SH2}$), a common-mode voltage source 518 ($V_{CM}$), and a gain stage 520. Buffer circuit 308 further includes a positive voltage output node 522 and a negative voltage output node 524 configured to output positive and negative samples ($V_{SH-P}$, $V_{SH-N}$) that together form discrete-time analog voltage values 526, $V_{SH}$, that are output from voltage output nodes 522, 524.

The "D" for the delayed phase one and two clocks 508, 510 refers to a delayed version of the clock. For example, delayed phase one clock 508 is delayed as compared to phase one clock 504 by an amount of time on the order of, for example a few nanoseconds. Likewise, delayed phase two clock 510 is delayed as compared to phase two clock 506 on the order of, for example, a few nanoseconds. In switched-capacitor circuits, delaying clocks in this fashion may be implemented to reduce signal-dependent charge injection resulting from charge in the channel of a metal-oxide-semiconductor field-effect transistor (MOSFET) switch dispersing when the switch opens.

In operation, chopped output voltage 434 is sampled on the first and second input capacitance stages (e.g., first and second input sampling capacitors 512, 514) in one phase and then the charge is combined with the charge on feedback capacitors 516 in another phase by configuring input sampling capacitors 512, 514 in parallel with respective feedback capacitors 516. In this example, there are two sets of input capacitors, e.g., first and second input sampling capacitors 512, 514, to sample both phases of the chopper output, e.g., chopped output voltage 434. While the current input (in time) is being sampled on one set of the input sampling capacitors (e.g., first sampling capacitors 512), charge stored on the other set of input sampling capacitors (e.g., second sampling capacitors 514) from the previous sampling instant is being combined with the charge on feedback capacitors 516. Thus, the fixed feedback capacitors 516 implement a filtering operation.

On average, the clock frequency is significantly higher than the filter cut-off frequency. Accordingly, the voltage across input sampling capacitors 512, 514 is equivalent to the voltage across feedback capacitors 516 so that when input sampling capacitors 512, 514 are configured to sample the input, e.g. chopped output voltage 434, the capacitance of capacitor 414 (FIG. 4) of anti-aliasing filter 312 of filter circuit 306 is not disturbed.

Figure 6:
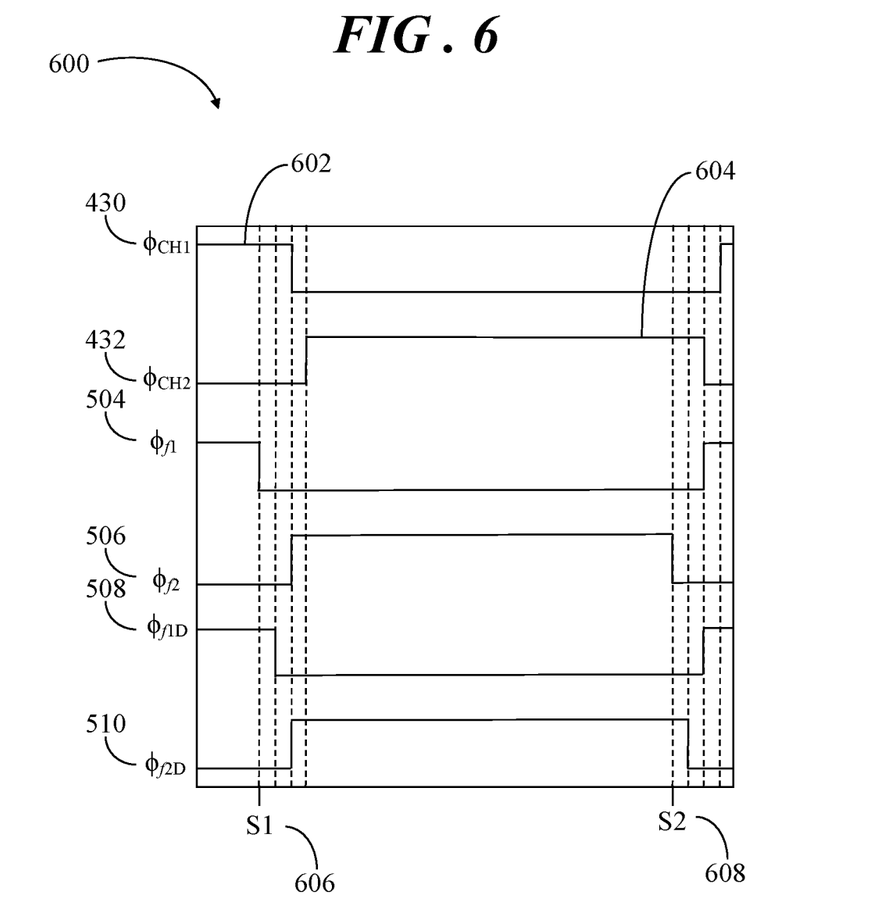
FIG. 6 shows a table of a timing diagram for the clocks of the chopper and buffer circuits of FIGS. 3-5.

FIG. 6 shows a table of a timing diagram 600 for the clocks of chopper and buffer circuits 304, 306 (FIGS. 3-5). In this example, buffer circuit 306 samples the chopper output (e.g., chopped output voltage 434, FIG. 4) on the negative edges of phase one and phase two clocks 504, 506. In this example, these negative edges occur once near the end of a positive phase 602 of first chopper clock 430 and once near the end of a positive phase 604 of second chopper clock 432. Accordingly, a first sample 606 can be obtained at the negative edge of phase one clock 504 and a second sample 608 can be obtained at the negative edge of phase two clock 506.

Figure 7:
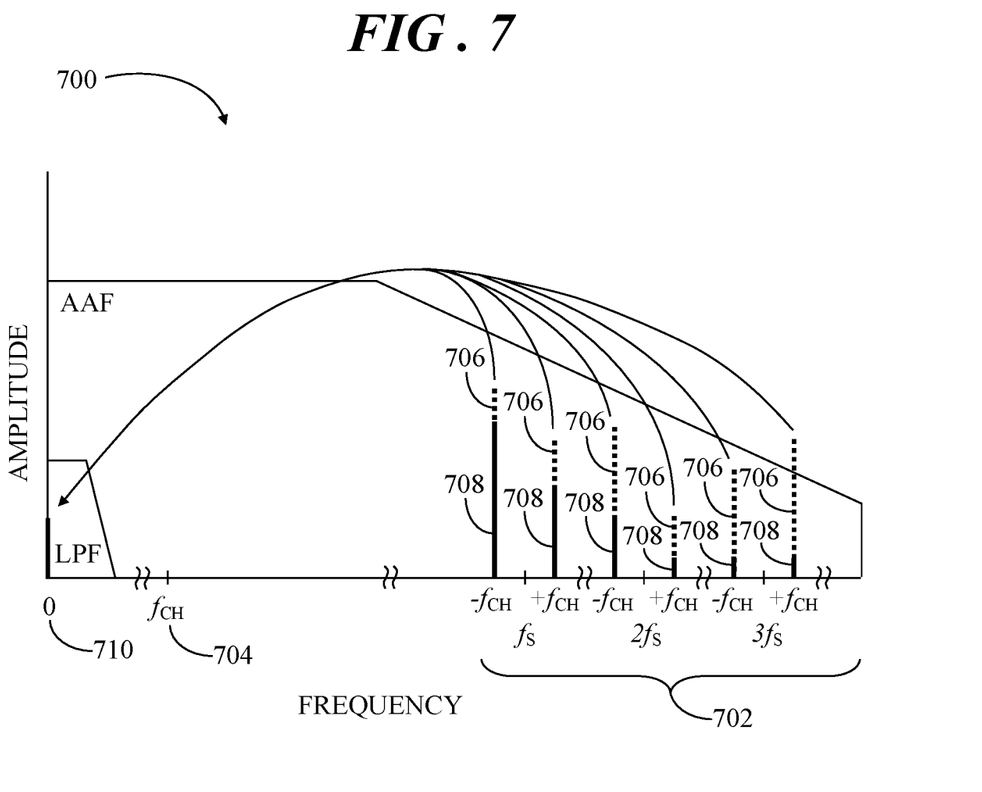
FIG. 7 shows a chart demonstrating attenuation of interference signal components by implementing an interface circuit of the sensor system of FIG. 3 in accordance with an embodiment.

FIG. 7 shows a chart 700 demonstrating attenuation of interference signal components by implementing interface circuit 310 (FIG. 3) of sensor system (FIG. 3) in accordance with an embodiment. Continuous-time C/V converter 304 passes high frequency interference signal components 702 without sampling to filter circuit 306. Anti-aliasing filter 312 of filter circuit 306 reduces, e.g., attenuates, the amplitude of interference signal components 702 especially at odd harmonics of a chopper fundamental frequency 704. In chart 700, the unattenuated portion of interference signal components 702 is represented by dotted line sections 706 and the remaining portion of interference signal components 702 is represented by solid line sections 708. In this example, chopper circuit 314, which has components at odd multiples of chopper fundamental frequency 704, may down-convert solid line sections 708 of interference signal components 702 to baseband 710, but the resulting in-band error is less. Thereafter, the first sampling instant (e.g., first sample 606, FIG. 6) occurs after the filter and chopper operations.

Figure 8:
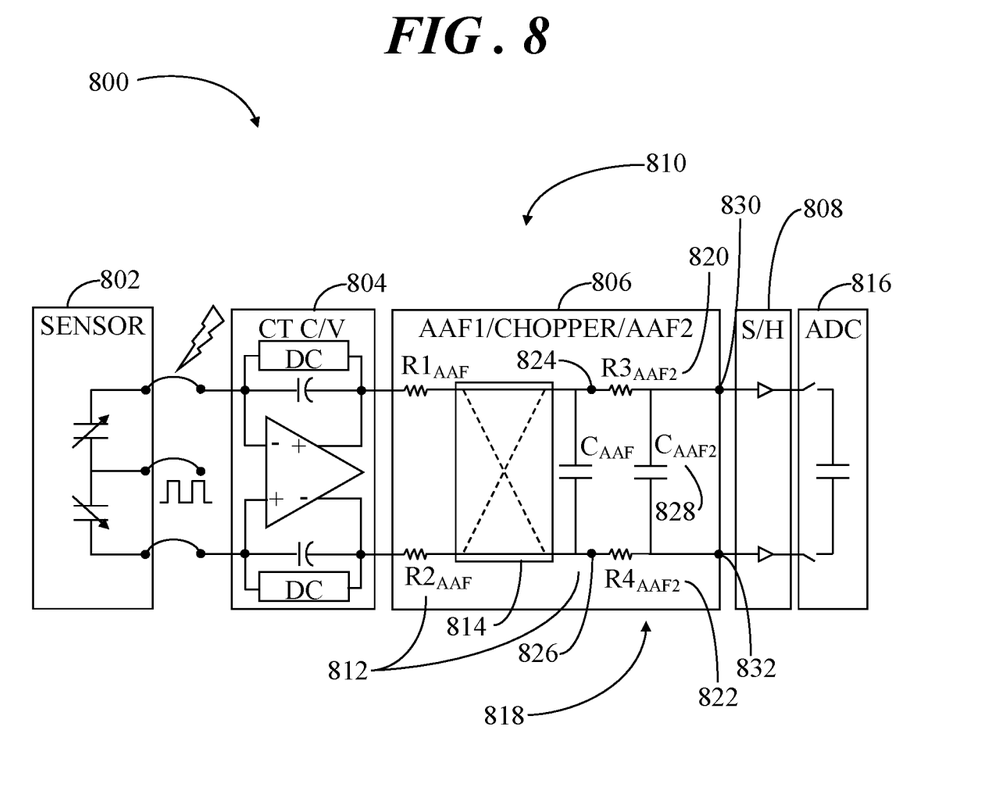
FIG. 8 shows a block diagram of a sensor system in accordance with another embodiment.

FIG. 8 shows a block diagram of a sensor system 800 in accordance with another embodiment. Sensor system 800 includes a capacitive sensor 802, a continuous-time C/V converter 804, a filter circuit 806, and a buffer circuit 808. In general, continuous-time C/V converter 804, filter circuit 806, and buffer circuit 808 constitute an analog frontend, e.g., an interface circuit 810, of sensor system 800. Filter circuit 806 includes an anti-aliasing filter 812, added around a chopper circuit 814. In some embodiments, an analog-to-digital converter 816 (ADC) may additionally be included. Elements 802, 804, 808, 812, 814, and 816 generally correspond with elements 302, 304, 308, 312, 314, and 316 of sensor system 300 of FIG. 3. Thus, a description of them will not be repeated herein for brevity.

Chart 700 of FIG. 7 only shows the down-converting of remaining interference 708 of interference signal components 702. In some instances, chopper circuit 314 (FIG. 3) may also up-convert remaining interference 708 of interference signal components 702, which may then fold into the signal band of interest when sampled by ADC 316 (FIG. 3). In the example of FIG. 8, anti-aliasing filter 812 may be considered a first filter, and filter circuit 806 of sensor system 800 further includes a second filter circuit 818 cascaded with the first filter circuit and interposed between anti-aliasing filter 812 and buffer circuit 808. Hence filter circuit 806 is labeled AAF1/CHOPPER/AAF2.

In some embodiments, second filter circuit 818 includes third and fourth resistors 820, 822 at corresponding third and fourth input ends 824, 826 of second filter circuit 818 and a second capacitor 828 connected between third and fourth output ends 830, 832 of second filter circuit 818. Thus, second filter circuit 818 constitutes a passive RC (resistor-capacitor) filter. In some embodiments, second filter circuit 818 may be configured to have the same cut-off frequency as the first filter circuit, e.g., anti-aliasing filter 812. Cascading another passive RC filter (e.g., second filter circuit 818) with the same cut-off frequency as the first passive RC filter (e.g., anti-aliasing filter 812) before buffer circuit 808 may contribute to additional attenuation of interference signal components 702.

Figure 9:
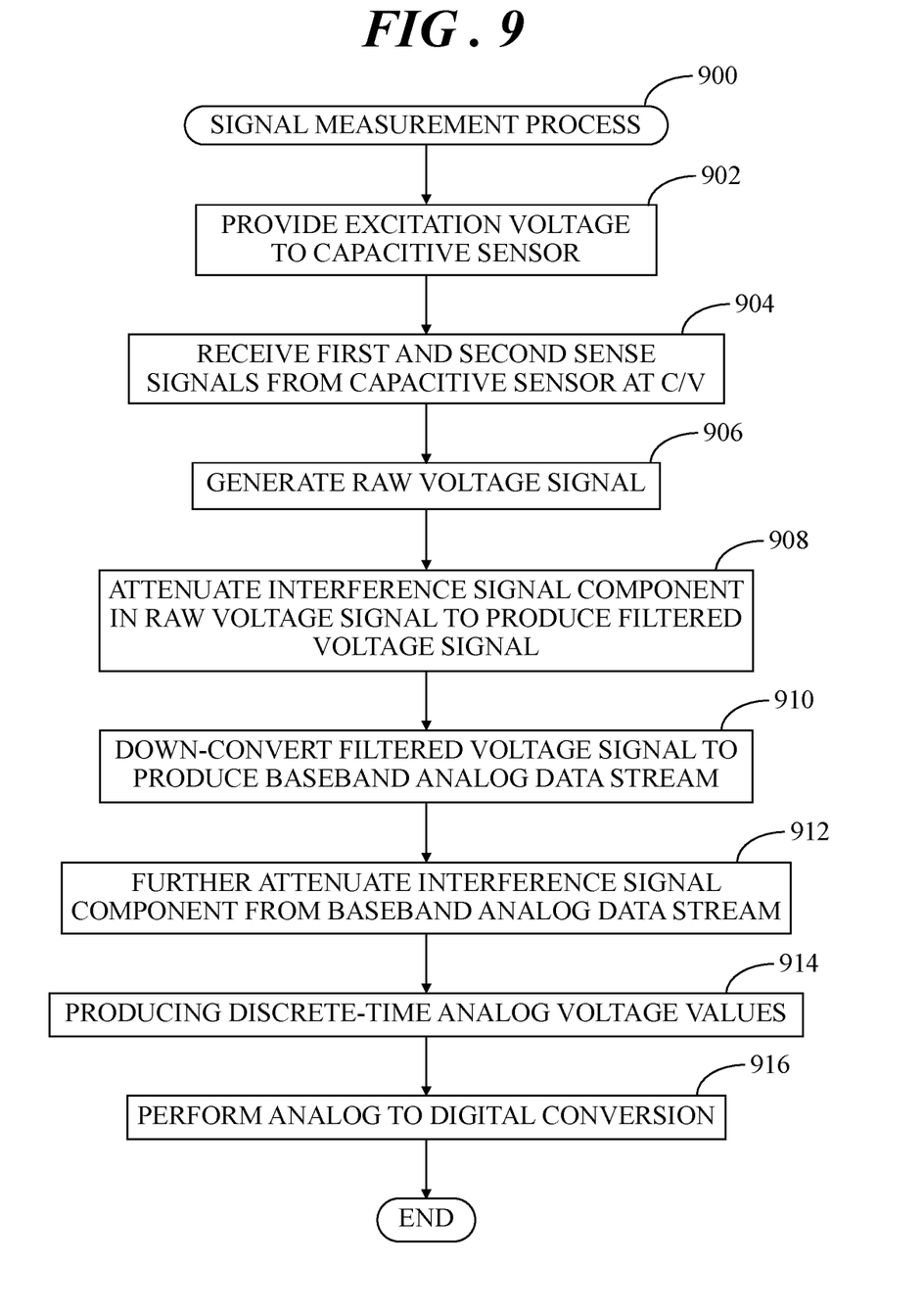
FIG. 9 shows a flowchart of a signal measurement process in accordance with another embodiment.

FIG. 9 shows a flowchart of a signal measurement process 900 in accordance with another embodiment. Signal measurement process 900 may be executed in connection with a sensor system having an interface circuit that includes a continuous-time C/V converter, a filter circuit having an anti-aliasing filter added around an output chopper, and a buffer circuit and/or with a sensor system that further includes a second filter cascaded with the anti-aliasing filter. For simplicity, reference should be made to sensor system 300 described above and shown in FIGS. 3-5 in connection with the following description. Signal measurement process 900 demonstrates a single measurement cycle for simplicity. It should be apparent that execution of signal measurement process 900 may be continuously repeated for a multiplicity of measurement cycles.

Signal measurement process 900 includes a number of process blocks, each of which will be described in detail below. Each process block generically illustrated in FIG. 9 may entail a single process or multiple sub-processes. Furthermore, the process blocks illustrated in FIG. 9 and described below are provided by way of non-limiting example. In alternative embodiments of signal measurement process 900, additional process blocks may be performed, certain process blocks may be omitted, and/or the illustrated process blocks may be performed in alternative sequences.

At a block 902, an excitation voltage is provided to capacitive sensor (e.g., excitation voltage 328 provided at middle node 322 of capacitive sensor 302). At a block 904, sense signals are received at a continuous-time C/V converter from the capacitive sensor (e.g., first and second sense signals 318, 320 are received at first and second input nodes 334, 336 at C/V input end 332 of continuous-time C/V converter 304 of interface circuit 310). At a block 906, a raw voltage signal is generated at the continuous-time C/V converter (e.g., first and second sense signals 318, 320 are converted to raw voltage signal 340 and output from continuous-time C/V converter 304 at first and second output nodes 400, 402 at C/V output end 348).

At a block 908, the interference signal components (e.g., interference signal components 702, FIG. 7) are attenuated in the raw voltage signal to produce a filtered voltage signal (e.g., anti-aliasing filter 312 filters raw voltage signal 340 to produce filtered voltage signal 436). At a block 910, the filtered voltage signal is down-converted to produce a baseband analog data stream (e.g., chopper circuit 314 performs chopping operations on filtered voltage signal 436 to produce chopped output voltage 434).

In some embodiments, a block 912 is performed to further attenuate the interference signal component the baseband analog data stream. For example, this secondary attenuation may be performed by implementing a second filter circuit (e.g., second filter circuit 818, FIG. 8) cascaded with the first filter circuit (e.g., anti-aliasing filter 812, FIG. 8) as discussed above in connection with sensor system 800 (FIG. 8).

At a block 914, discrete-time analog voltage values are produced (e.g., buffer circuit 308 performs a sample-and-hold function to produce discrete-time analog voltage values 526 which are output from buffer circuit 308). Accordingly, signals from the capacitive sensor are first sampled after filtering and demodulation at the buffer circuit. At a block 914, analog-to-digital conversion is performed (e.g., discrete-time analog voltage values 526 from buffer circuit 308 are converted to digital data stream 354 at ADC 316). Thereafter, signal measurement process 900 ends.

Embodiments described herein entail a sensor interface circuit, a sensor system, and a method of signal measurement. More particularly, the sensor interface circuit includes a continuous-time capacitance-to-voltage (C/V) converter and a passive anti-aliasing filter (AAF), in which the AAF is added around an output chopper circuit. In this sensor interface circuit architecture, a sensor output signal from a capacitive sensor is first sampled by an active sample-and-hold circuit at the input to an analog-to-digital converter after filtering at the AAF. The output chopper circuit is interposed between the resistors and a capacitor of the AAF so that the raw voltage signal from the continuous-time C/V is filtered before the chopping operation (e.g., demodulation). By filtering the raw voltage signal prior to demodulation, the high-frequency interference components in the raw voltage signal may be attenuated before down-conversion. Further, the bandwidth of the AAF may not attenuate signals in the signal band of interest, which at the output of the continuous-time C/V, is a small band of frequencies around the chopper frequency. Consequently, the architecture of the sensor interface circuit may have reduced susceptibility to electromagnetic interference, therefore resulting in less error in the desired signal.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A sensor interface circuit comprising:
a continuous-time capacitance-to-voltage (C/V) converter having C/V input and output ends, the C/V input end being configured for electrical connection with first and second sense nodes of a capacitive sensor;
a filter circuit having first and second resistors at corresponding first and second filter input ends of the filter circuit, a capacitor connected between first and second filter output ends of the filter circuit, and a chopper circuit interposed between the first and second filter input ends and the first and second filter output ends, wherein the C/V output end of the continuous-time C/V converter is electrically coupled to the first and second filter input ends of the filter circuit; and
a buffer circuit electrically coupled with the first and second filter output ends of the filter circuit.

2. The sensor interface circuit of claim 1 wherein the continuous-time C/V converter comprises a continuous-time gain stage implemented with a capacitor feedback stage, and further implemented with a direct current (DC) feedback circuit, wherein the DC feedback circuit is configured to set a DC bias for the continuous-time gain stage.

3. The sensor interface circuit of claim 1 wherein the first and second resistors and the capacitor of the filter circuit constitute a passive anti-aliasing filter.

4. The sensor interface circuit of claim 1 wherein:
the capacitive sensor is configured to produce a first sense signal at the first sense node and a second sense signal at the second sense node, each of the first and second sense signals including an interference signal component;
the continuous-time C/V converter is configured to generate a raw voltage signal in response to receipt of the first and second sense signals, the raw voltage signal including the interference signal component;
the filter circuit is configured to attenuate the interference signal component from the raw voltage signal at the first and second resistors to produce a filtered voltage signal; and
the chopper circuit is configured to down-convert the filtered voltage signal following attenuation of the interference signal component to produce a baseband analog data stream that is output from the filter circuit at the first and second filter output ends.

5. The sensor interface circuit of claim 4 wherein the capacitive sensor further includes a third node interposed between the first and second sense nodes, the third node being configured to receive an alternating waveform excitation voltage, wherein the alternating waveform excitation voltage is configured to up-convert each of the first and second sense signals to a chopper fundamental frequency of the chopper circuit.

6. The sensor interface circuit of claim 5 wherein the buffer circuit is configured to receive the baseband analog data stream, filter a chopper fundamental frequency and harmonics of the chopper fundamental frequency from the baseband analog data stream, and produce discrete-time analog voltage values that are output from a buffer output end of the buffer circuit.

7. The sensor interface circuit of claim 6 further comprising an analog-to-digital converter (ADC) having an input electrically coupled to the buffer output end of the buffer circuit, the ADC being configured to convert the discrete-time analog voltage values to a digital data stream.

8. The sensor interface circuit of claim 4 wherein the buffer circuit comprises a first input capacitance stage configured to sample the baseband analog data stream in a first sampling phase to obtain a first voltage value and apply the first voltage value in feedback in a second sampling phase.

9. The sensor interface circuit claim 8 wherein the first input capacitance stage is configured to sample the baseband analog data stream during a first output phase of the chopper circuit, and the buffer circuit further comprises a second input capacitance stage configured to sample the baseband analog data stream during a second output phase of the chopper circuit.

10. The sensor interface circuit of claim 1 wherein the filter circuit is a first filter circuit, and the sensor interface circuit further comprises a second filter circuit cascaded with the first filter circuit, and interposed between the first filter circuit and the buffer circuit.

11. The sensor interface circuit of claim 10 wherein the first and second filter circuits are configured to have the same cut-off frequency.

12. The sensor interface circuit of claim 1 wherein:
the capacitive sensor is implemented on a first die;
the continuous-time C/V converter is implemented on a second die; and
bond wires electrically connect the first and second sense nodes of the capacitive sensor of the first die to the C/V input end of the continuous-time C/V converter of the second die.

13. A method comprising:
receiving, at a continuous-time capacitance-to-voltage (C/V) converter, first and second sense signals from a capacitive sensor;
generating, at the continuous-time C/V converter, a raw voltage signal in response to the first and second sense signals, each of the first and second sense signals including an interference signal component, and the raw voltage signal including the interference signal component;

attenuating the interference signal component in the raw voltage signal at a filter circuit to produce a filtered voltage signal; and following attenuation of the interference signal component, down-converting the filtered voltage signal to produce a baseband analog data stream;

receiving, at a buffer circuit, the baseband analog data stream;

filtering, at the buffer circuit, a chopper fundamental frequency and harmonics of the chopper fundamental frequency from the baseband analog data stream; and producing, at the buffer circuit, discrete-time analog voltage values.

14. The method of claim 13, further comprising converting, at an analog-to-digital converter, the discrete-time analog voltage values to a digital data stream.

15. A method comprising:

receiving, at a continuous-time capacitance-to-voltage (C/V) converter, first and second sense signals from a capacitive sensor:

generating, at the continuous-time C/V converter, a raw voltage signal in response to the first and second sense signals, each of the first and second sense signals including an interference signal component, and the raw voltage signal including the interference signal component;

attenuating the interference signal component in the raw voltage signal at a filter circuit to produce a filtered voltage signal; and following attenuation of the interference signal component, down-converting the filtered voltage signal to produce a baseband analog data stream;

wherein the filtered voltage signal includes a remaining portion of the interference signal component, and the method further comprises:

following the down-converting operation, attenuating at least part of the remaining portion of the interference signal component from the baseband analog data stream at a second filter circuit.

16. A sensor system comprising:

a first die having a capacitive sensor implemented thereon, the capacitive sensor having a first and second sense nodes;

a second die, having a continuous-time capacitance-to-voltage (C/V) converter, a filter circuit, and a buffer circuit implemented thereon, wherein:

the continuous-time C/V converter has C/V input and output ends, the C/V input end being configured for electrical connection with the first and second sense nodes of the capacitive sensor, the continuous-time C/V converter comprising a continuous-time gain stage implemented with a capacitor feedback stage, and further implemented with a direct current (DC) feedback circuit, wherein the DC feedback circuit is configured to set a DC bias for the continuous-time gain stage;

the filter circuit has first and second resistors at corresponding first and second filter input ends of the filter circuit, a capacitor connected between first and second filter output ends of the filter circuit, and a chopper circuit interposed between the first and second filter input ends and the first and second filter output ends, wherein the C/V output end is electrically coupled to the first and second filter input ends; and the buffer circuit is electrically coupled with the first and second output ends of the filter circuit; and bond wires electrically connecting the first and second sense nodes of the first die to the C/V input end of the continuous-time C/V converter of the second die.

17. The sensor system of claim 16 wherein:

the capacitive sensor is configured to produce a first sense signal at the first sense node and a second sense signal at the second sense node, each of the first and second sense signals including an interference signal component;

the continuous-time C/V converter is configured to generate a raw voltage signal in response to receipt of the first and second sense signals, the raw voltage signal including the interference signal component;

the filter circuit is configured to attenuate the interference signal component in the raw voltage signal to produce a filtered voltage signal; and the chopper circuit is configured to down-convert the filtered voltage signal following attenuation of the interference signal component to produce a baseband analog data stream that is output from the filter circuit at the first and second filter output ends.

18. The sensor system of claim 17 wherein:

the buffer circuit is configured to receive the baseband analog data stream, filter a chopper fundamental frequency and harmonics of the chopper fundamental frequency from the baseband analog data stream, and produce discrete-time analog voltage values that are output from a buffer output end of the buffer circuit; and the sensor system further comprises an analog-to-digital converter (ADC) having an input electrically coupled to the buffer output end of the buffer circuit, the ADC being configured to convert the discrete-time analog voltage values to a digital data stream.

19. The sensor system of claim 16 wherein the filter circuit is a first filter circuit, and the sensor system further comprises a second filter circuit cascaded with the first filter circuit, and interposed between the first filter circuit and the buffer circuit.

20. The sensor interface circuit of claim 1, wherein the first resistor of the filter circuit is coupled between the first input end of the filter circuit and the chopper circuit; and wherein the second resistor of the filter circuit is coupled between the second input end of the filter circuit and the chopper circuit.

* * * * *